(12) United States Patent
Dürr et al.

(10) Patent No.: US 6,600,664 B2
(45) Date of Patent: Jul. 29, 2003

(54) SHIELDED SWITCHGEAR CABINET HOUSING

(75) Inventors: Wolfgang Dürr, Meckesheim (DE);
Georg Glaunsinger, Meckesheim (DE);
Johann Schunn, Leimen (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 0 days.

(21) Appl. No.: 09/858,419

(22) Filed: May 16, 2001

(65) Prior Publication Data

US 2001/0043466 A1 Nov. 22, 2001

(30) Foreign Application Priority Data

May 16, 2000 (DE) .......................................... 100 23 616

(51) Int. Cl.[7] .................................................. H05K 9/00
(52) U.S. Cl. ........................ 361/816; 361/818; 361/800; 174/35 R
(58) Field of Search .................. 361/816, 818, 361/800, 753, 801, 730, 751; 174/35 R, 35 GC

(56) References Cited

U.S. PATENT DOCUMENTS

| 5,120,903 | A | * | 6/1992 | Tam ...................... 174/35 GC |
| 5,202,536 | A | * | 4/1993 | Buonanno .............. 174/35 GC |
| 6,125,584 | A | * | 10/2000 | Sanders ..................... 49/312 |
| 6,303,854 | B1 | * | 10/2001 | Papaleo et al. ........... 174/35 R |

FOREIGN PATENT DOCUMENTS

| DE | 3500362 C2 | 2/1991 |
| DE | 91 07 917.9 U1 | 10/1991 |
| DE | 4102019 C1 | 7/1992 |
| DE | 4207308 C2 | 11/1995 |
| DE | 296 09 873 U1 | 10/1996 |
| DE | 196 10 045 A1 | 9/1997 |
| DE | 19823651 C1 | 10/1999 |
| EP | 0378392 A1 | 1/1990 |

* cited by examiner

Primary Examiner—David Martin
Assistant Examiner—Hung Bui
(74) Attorney, Agent, or Firm—Laurence A. Greenberg; Werner H. Stemer; Ralph E. Locher

(57) ABSTRACT

A housing of a switchgear cabinet for a printing machine, with housing elements formed of electrically conductive material having an electrically insulating surface layer, includes at least one door, one body and one electrically conductive elastic seal disposed therebetween, respective mutually allocated elements of the housing elements having corresponding electrically conductive contact locations at electrically conductive strip material connected to the conductive material of the housing elements; each of the contact locations being covered by a protective layer which is removable during assembly of the cabinet, for the purpose of electrically conductively connecting the housing elements and the seal.

12 Claims, 2 Drawing Sheets

SHIELDED SWITCHGEAR CABINET HOUSING

BACKGROUND OF THE INVENTION

Field of the Invention

The invention relates to a housing of a switchgear cabinet for a printing machine, with housing elements formed of electrically conductive material, which have an electrically insulating surface layer, and which include at least one door, one body and one electrically conductive elastic seal disposed therebetween.

The cabinet includes a body, at least one door and at least one electrically conductive seal that is disposed therebetween for the purpose of sealing and shielding the housing elements. The body is formed of various housing elements, such as ceilings, floors, walls, and detachable accessories or insertion parts for receiving the components or subassemblies of the electronic control.

The housing elements are produced from electrically conductive material. Steel or steel plate are preferably utilized for this purpose. They are protected against corrosion by an appropriate surface treatment such as varnishing, coating or surface tempering. In this process, the housing elements are individually surface-treated and then assembled into the switchgear cabinet.

To ensure undisturbed operation, it is necessary to satisfy electromagnetic compatibility (EMC) requirements, whereby electromagnetic fields must be shielded. On one hand, the interior of the switchgear cabinet must be kept free of electromagnetic fields, and on the other hand, the environment must be protected from electromagnetic fields which arise in the interior of the cabinet. It is also possible to provide separate electromagnetic shielding for individual compartments in the interior of the cabinet.

It is particularly important that the surface of the cabinet or of the individual compartments be completely electrically conductive. An electrical field acts upon the conductive surface to the effect that charge displacements are generated in the conductive housing material, which produces a charging of the surface. These charges of the cabinet, known as surface charges, generate a field which precisely counteracts the field acting upon the surface. The interior of the cabinet is then ideally entirely free of fields. The functional principle that is used therein is based on what is known as the Faraday effect, with the cabinet forming a so-called Faraday cage.

To achieve complete shielding, the cabinet must be produced with an optimally uniformly conductive surface, so that disturbances stemming from various properties or thicknesses of the materials or other instabilities in the surface can be avoided. Particularly in moving parts such as the door, all edges must be conductively connected to the body, because unstable points of the surface will emerge there otherwise, at which a transfer of electromagnetic fields could occur.

In addition, the housing of the switchgear cabinet must be sealed against dust, oil vapors, and moisture (IP) and against other environmental influences in the vicinity of the machine operation.

German Patent 196 10 045 thus proposes the disposing of an EMC seal between the body and the door. The EMC seal is electrically conductive and elastic, and connects the housing elements which are allocated to one another. To this end, seals made of conductive plastic material, plastic-material seals having electrically conductive coverings, or electrically conductive metal nettings and braidings (for example, sheet covers having contact locations or points at the adjoining housing element) are proposed. Additional EMC seals which serve various functions such as sealing a window or a mountable coverplate are known from German Patents 9107917 and 296 09 873.

A disadvantage of these seals is that the insulating surface treatment renders the connections between the mounted housing elements, i.e., between the seal and the body or the door, insufficiently conductive. As a result, the housing of the cabinet has the required thorough and stable electrical conductivity only accidentally, if at all.

In addition, so-called two-chamber systems have become known, which have an inner housing made of conductive material, e.g., hot-galvanized sheet and state-of-the-art EMC seals, and an outer housing wherein the inner housing is disposed. The outer housing is produced from varnished sheetmetal or plastic material with corresponding seals against dust and moisture. A disadvantage of this arrangement is in the production outlay and the associated cost disadvantages, as well as poor accessibility, because the various housings impede access to the electronic components or subassemblies in the interior of the cabinet.

An additional measure is to provide a varnished housing having two seals, one of which is provided against dust and moisture (IP), and the other of which is provided as an EMC shield. What poses the biggest problem here is obtaining good and reliable conductivity over the course of several years, as well as the high outlay in production.

The published German Patent Document DE 42 07 308 C2 teaches a method for producing a sheetmetal housing from a housing body having at least one sealing part wherein the housing body and an opening can be connected to one another in an electrically and magnetically conductive manner. To this end, the housing body is greased, and a contact surface is then placed on the housing body in a flame injection procedure and covered with a cover strip. Next, the housing body is cleaned and varnished, and the cover strip is removed. The sealing part is either chromated or is formed of rustproof material, or it is provided with a contact surface in the same manner. Next, the housing body and the sealing part are connected to an elastic HF sealing element. This method is disadvantageous due to the great outlay and the associated costs.

SUMMARY OF THE INVENTION

It is accordingly an object of the invention to overcome the above mentioned disadvantages by providing a shielded switchgear cabinet housing with surface-treated housing elements with which it is possible to obtain an optimal shielding against electromagnetic fields, in particular by producing considerably uniform conductivity of the overall switchgear cabinet.

With the foregoing and other objects in view, there is provided, in accordance with the invention, a housing of a switchgear cabinet for a printing machine, with housing elements formed of electrically conductive material having an electrically insulating surface layer, comprising at least one door, one body and one electrically conductive elastic seal disposed therebetween, respective mutually allocated elements of the housing elements having corresponding electrically conductive contact locations at electrically conductive strip material connected to the conductive material of the housing elements; each of the contact locations being covered by a protective layer which is removable during assembly of the cabinet, for the purpose of electrically conductively connecting the housing elements and the seal.

In accordance with another feature of the invention, the protective layer is formed of at least one material selected from the group consisting of paper, plastic material, metal and a composite material.

In accordance with a further feature of the invention, the contact locations are elevations which are embossed and/or stamped in the conductive material of the respective housing element.

In accordance with an added feature of the invention, the contact locations form a contact surface.

In accordance with an additional feature of the invention, the strip material is covered with a removable film.

In accordance with yet another feature of the invention, mutually corresponding contact locations are constructed at the housing elements, which are to be connected as a borehole into which a self-cutting conductive screw with a cutting thread is screwable, the self-cutting screw, when tightened, serving for cutting into the conductive material and for gas-tightly sealing the borehole.

In accordance with yet a further feature of the invention, the self-cutting screw has at least one cutting element on an inner surface of a screw head thereof, and when the screw is tightened, the cutting element serves for cutting through the insulating surface coating into the conductive material of a respective adjoining housing element.

In accordance with yet an added feature of the invention, the cutting element is an annular or ring cutter.

In accordance with yet an additional feature of the invention, the self-cutting screw has a surface with low contact resistance.

In accordance with still another feature of the invention, the surface of the self-cutting screw is selected from the group consisting of zinc-plated, nickel-plated, chromated and blue-chromated surfaces.

In accordance with still a further feature of the invention, the seal is electrically conductively secured via a contact surface to at least one of the door and the body and, assuming that the door is closed, contacts corresponding contact locations on an allocated opposing surface for assuring a conductive connection.

In accordance with a concomitant feature of the invention, the strip material is flexible.

Thus, provided in accordance with the invention is that the joint surfaces of the housing elements are kept electrically conductive. To this end, contact locations are produced at the joint surfaces of the conductive materials of the housing elements and provided with a protective layer prior to the varnishing or surface coating. The contact locations are covered by the protective layer when they are varnished or coated with an insulating material. The protective layer is not removed until the cabinet is assembled, so that after assembly a permanently electrically conductive connection emerges between the individual housing parts by way of the direct contact of the conductive housing elements at the contact locations. The protective layer is applied to the conductive material of the housing elements prior to the varnishing or coating of the conductive housing elements, so that a residue-free conductive surface is available for the conductive assembly process.

Advantageously provided for is that the protective layer is formed of paper, plastic material, metal and/or a composite material. Simplicity is served in that conventional film or foil-type cover materials can be utilized, for example, materials which are provided with an adhesive layer on one side that can easily be removed from the electrically conductive material of the housing elements. Materials made of composites having a stable, torsionally resistant carrier layer including an absorbent layer have proven to be particularly well suited. The absorbent layer can, in accordance with the invention, consist of paper or a similar material, and the torsionally resistant carrier layer can be produced from plastic material or metal.

An advantageous embodiment of the invention is realized in that the contact locations are elevations which are embossed or stamped into the conductive material of the housing element. In order to be able to produce a conductive connection between the housing elements, the contact locations must be constructed so that the material thickness of the varnish or coating of the two adjacent housing elements is overcome, because the contact locations would otherwise be spaced a corresponding distance from one another. To this end, provision is made for this equalization to be produced by slight elevations which are preferably embossed or stamped. The elevations should be constructed so that the housing does not become leaky. This is preferably achieved in that the elevation exclusively compensates for the material thickness of the surface coating at the contact surfaces, so that the housing elements abut one another on flat surfaces.

Another embodiment is achieved by the fact that the contact locations form a contact surface. To achieve an optimal seal and shielding of the housing, there is provided, in accordance with the invention, that the contact locations be produced as contact surfaces. This is achieved in, accordance with the invention, by the fact that the contact locations are at an electrically conductive, preferably flexible strip material, which is connected to the conductive material of the housing element. The strip material can thus be applied to the blank conductive housing element prior to the treatment of the surface. So that the strip has a conductive contact surface subsequent to the surface treatment, it is further provided that the strip material be covered with a removable film. The film is preferably heat-resistant and can be removed following the surface treatment.

This preferably self-adhesive strip is constructed, according to the invention, as fabric tape. It includes a conductive glue on one side and is formed of conductive material. The fabric tape is covered by a protective film that is removable. The fabric tape is particularly well suited to remaining free of deformations and maintaining electrical conductivity in the subsequent combustion process for burning-in the varnish.

Furthermore, the film over the self-adhesive fabric tape is approximately 1 mm narrower than the actual fabric tape in the marginal region. Thus, in the varnishing process, the varnish is also applied to the fabric tape, at least at the margins, which imparts an additional holding effect to the fastening action. The conductive adhesive is insensitive to various solvents of the pretreatment agents which are required in order to pretreat the cabinet prior to varnishing, and also to varnishing and or coating materials. Also, the removable film has a corresponding resistance. The tape material and the film are also stable especially at the high temperatures which are needed to burn-in the varnish. When the film is removed following the cleaning, varnishing, and burn-in processes, the film does not leave behind any adhesive or other residues on the conductive fabric tape. This embodiment thus represents a simple and economical possibility for producing a conductive connection.

The housing elements can be connected by clamps or clips, in a conventional manner. An inventive alternative for fixing the housing elements is realized in that mutually corresponding contact locations are constructed as boreholes at the housing elements that are to be connected, into which a conductive self-cutting screw having a cutting thread can be inserted; and the self-cutting screw cuts into the conductive material when the screw is tightened. The housing elements can thus be fixed to one another by screw connections and, at the same time, a conductive connection is produced, whereby the self-cutting thread cuts into the conductive material of the housing elements when tightened. Boreholes wherein the screws are inserted are provided at the housing elements for this purpose.

Another embodiment is prepared by providing that the self-cutting screw has at least one cutting element located at the inner screw head thereof, preferably an annular blade, and that the cutting element cuts through the insulating surface coating into the conductive material of the adjoining housing element when the screw is tightened. This enhancement of the screw produces an improved conductivity of the screw and the screw head with the adjoining housing element. Provided in accordance with the invention is that the screw cut the self-cutting thread thereof into a borehole at the other housing element. The adjoining housing element is simply pressed to the other housing element by the pressing force of the screw head. So that the screw head produces a conductive connection to the adjoining housing element, the cutting element is provided so as to cut through the insulating surface coating into the conductive material of the housing element. According to the invention, an annular or ring blade is advantageous in this regard.

In principle, any conductive screw with a self-cutting thread which is made of sufficiently hard material is suitable. It has proven particularly advantageous when the self-cutting screw has a surface with low contact resistance, which is preferably zinc- or nickel-plated, chromated or blue-chromated. An improved conductivity can be achieved advantageously by the surface treatment of the screw. Furthermore, a low contact resistance is achieved with the surface-treated screw, which makes possible an optimal conductivity, i.e., an optimal shielding.

The contact locations produced in accordance with the invention can be used to achieve an electrically conductive connection between the EMC seal and the door and/or the body by way of a contact surface. When the door is closed, it contacts corresponding contact locations on an allocated opposing surface and ensures a conductive connection. This produces an optimal shielding of the housing, because the seal connects the contact surfaces at both housing elements. The seal thus creates a conductive connection between two mutually allocated housing elements which are not connected to one another directly.

In another advantageous embodiment, provision is made for the seal to be electrically conductively fastened to the door and/or the body by way of a contact surface, and for it to contact corresponding contact locations on an allocated opposing surface when the door is closed, thereby ensuring a conductive connection. The seal may be fastened to the door or the body. For this purpose, the door has a number of contact locations, or a contact surface. These encompass the entire fastening surface of the seal at the door. The opposing surface is then disposed at the body and likewise includes a number of contact locations for producing the electrical connection between the two housing elements. On the other hand, the seal can be fastened at the body, which then has the corresponding contact surface, while the opposing surface that is provided with corresponding contact locations is disposed at the door. The seal is advantageously constructed as a plug seal that is insertable in separately provided fastening openings in order to fasten the strip material, and that clamps the strip material between the seal and the housing element.

Other features which are considered as characteristic for the invention are set forth in the appended claims.

Although the invention is illustrated and described herein as embodied in a shielded switchgear cabinet housing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, wherein:

DESCRIPTION OF THE PREFERRED EMBODIMENTS

Figure 1:
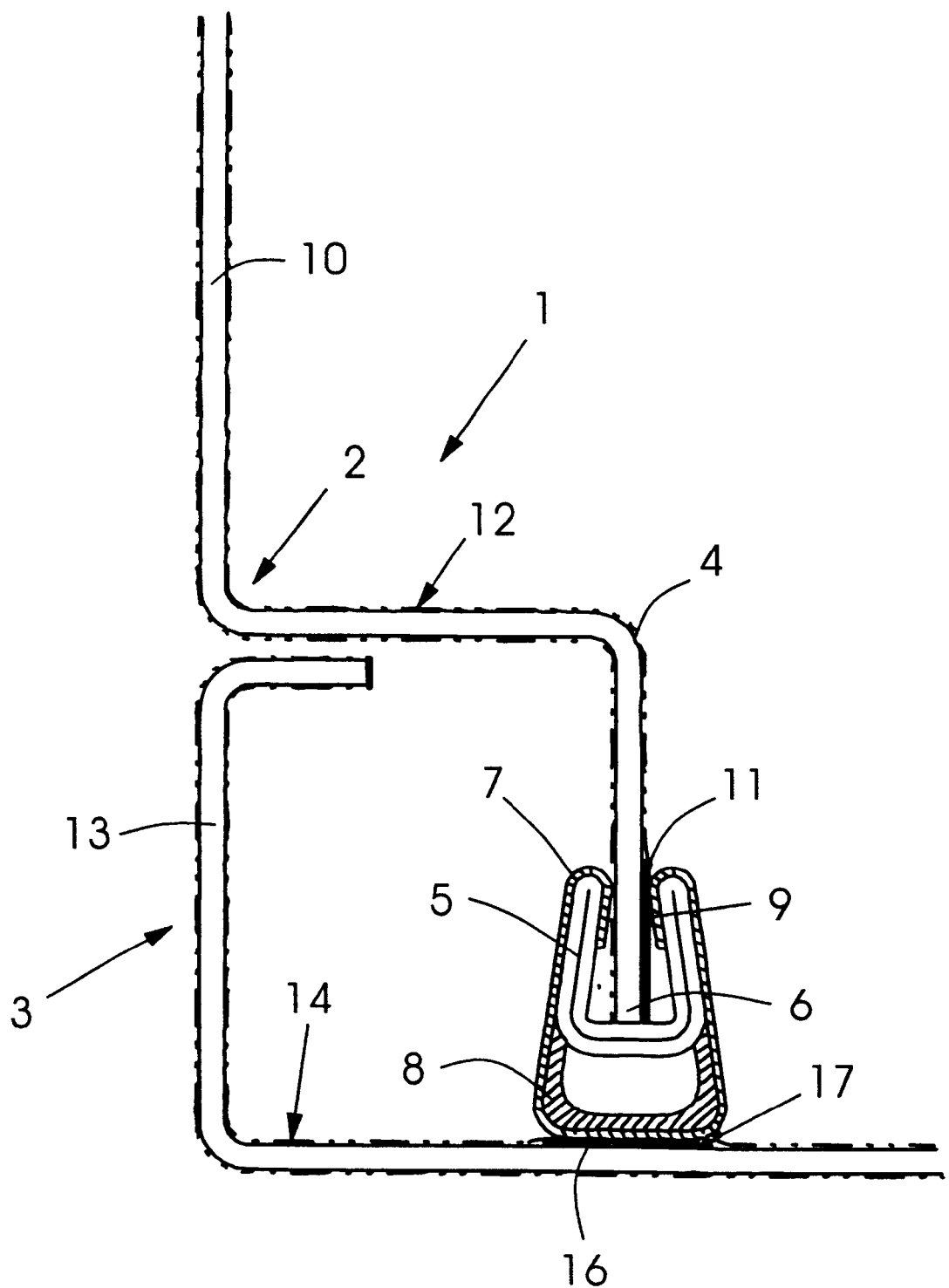
FIG. 1 is a fragmentary sectional view of a switchgear cabinet having a conductive seal and fabric tape.

Referring now to the drawings and, first, particularly to FIG. 1 thereof, there is shown therein a switchgear cabinet 1 having an arrangement of two housing elements. The housing elements are a body 2 and a door 3, which adjoins the body 2 in the closed condition thereof. To seal and shield the cabinet 1, at the end of the wall 4 of the body 2, a seal 5 is situated at an edge 6. The seal 5 is constructed as a plug seal and is plugged on at the edge 6. It is surrounded by a conductive fabric tape 7 and has an elastic region 8. The wall 4 is formed of a conductive material 10, preferably steel sheet, which is covered by an insulating surface coating 12 and provided with contact points 9. The insulating coating 12 is realized as varnish, in accordance with the invention, and is represented in the drawing by broken lines.

To electrically conductively connect the seal 5, i.e., the fabric strip 7, to the conductive material 10 of the wall 4, i.e., to the body 2, the contact points 9 are provided, which are produced by a conductive fabric strip 11 which forms a contact surface along the edge 6, which is disposed perpendicularly to the plane of projection. The fabric strip 11 is connected to the conductive material 10 of the wall 4, having been applied to the blank conductive material 10 of the wall 4 prior to the varnishing step for this purpose. It includes the removable protective layer on the top side. On the bottom side, it is preferably fastened using a conductive glue which is not represented in the drawing. When it is plugged on, the seal 5 extends via the edge 6 with the conductive fabric strip 7 and contacts the fabric strip 11, the protective layer of which was removed after the varnishing process, with the conductive surface thereof.

In FIG. 1 of the drawings, one side of the wall 4 is provided with the conductive fabric strip 11, whereon the conductive fabric strip 7 contacts the seal 5. Also provided in accordance with the invention is that the fabric strip 11 wraps around the edge 6 on both sides of the wall 4, and that the seal 5 makes electrical contact with the fabric strip 7 on both sides. In this way, an enlarged contact surface and a smaller contact resistance can be achieved at this location.

Like the wall 4, the door 3 is formed of electrically conductive material 13, preferably steel sheet, which is provided with an insulating surface coating 14. The surface coating 14 is preferably realized as a varnish. The varnish is drawn beyond the fabric strip 17 in an overlap region 15 and produces a fastening effect at the contact point which enhances the glue. Contact points 16 which are connected to the conductive material 13 are provided at the location at which the seal 5 of the wall 4 contacts the door 3. These are produced like the contact points 9 and include the conductive fabric strip 17. The fabric strip 17 forms the opposing surface to the joint surface of the seal 5 and likewise forms a contact surface along the joint surface.

When the door 3 is closed, the seal 5 with the surrounding conductive fabric strip 7 is pressed to the contact points 16 with the conductive fabric strip 17 and creates an electrically conductive connection between the conductive material 13 of the door 3 and the conductive material 10 of the body 2. The seal 5 is guided all the way around the edge 6 of the body 2 and, together with the opposing surface at the door 3, forms a complete seal against environmental influences such as dust, oil (i.e. vapors from cooling medium) and other impurities and also provides total shielding against electromagnetic fields.

The invention also includes a modification or improvement of the foregoing embodiment wherein the seal 5 is fastened at contact points 16 of the door 3, and the opposing surface with the contact points 9 is disposed at the body 2.

Figure 2:
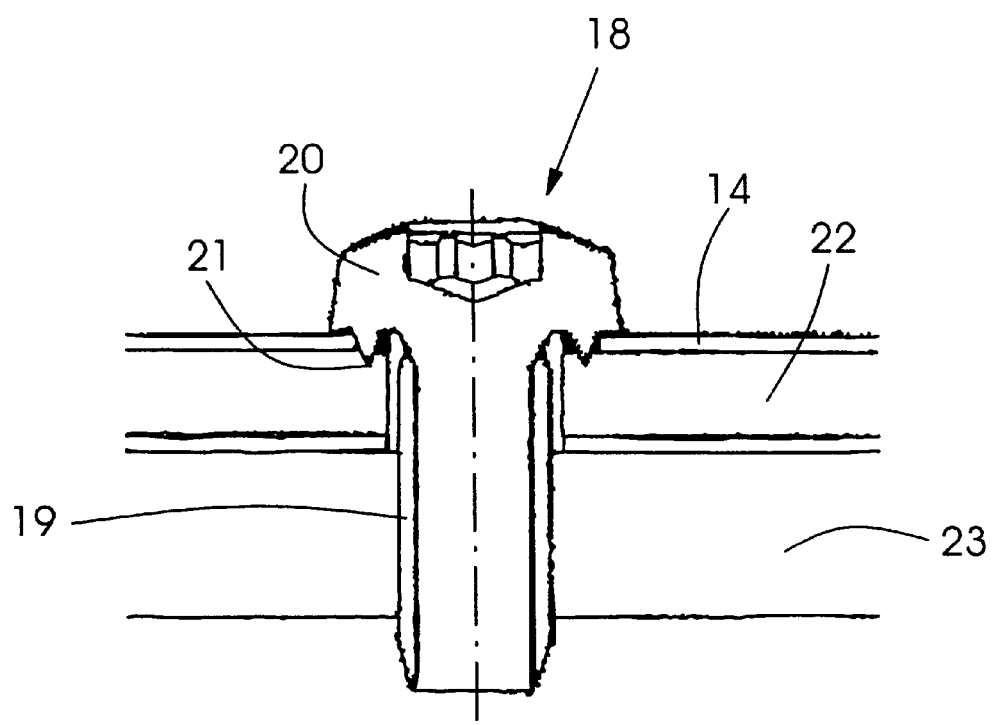
FIG. 2 is a side elevational view of a self-cutting screw for producing contact locations.

FIG. 2 shows a self-cutting screw is for producing contact points 9 and 16. The contact points 9 and 16 are not produced exclusively in the region of the seal 5 at the body 2 or at the door 3 but rather at the other housing elements, such as the walls 4, the floor and the ceiling of the body 2. In order to create conductive contact points there, between the joint surfaces that are allocated to one another, the self cutting screw 18 is provided with a conductive cutting thread 19. The cutting thread 19 serves to cut through the insulating surface coating of the housing elements into the conductive material 10, 13. In order to obtain a larger contact surface of the screw 18, the screw head 20 is provided with a cutting element 21 on the interior surface thereof, which is shaped as an annular blade in the drawing. The annular blade 21 is pushed through the surface coating when the screw 18 is tightened, whereby it penetrates into the conductive material 10, 13 of the housing element adjoining the screw head 20.

At least the housing element that is situated distal from the screw head is formed with a borehole, as contact points 9, having a smaller diameter than that of the cutting thread 19, 16. An alternative embodiment provides boreholes at every housing element. In the boreholes, the cutting thread 19 penetrates through the surface coating, i.e. the varnish, into the conductive material 9, 13.

We claim:

1. A housing of a switchgear cabinet for a printing machine, with housing elements formed of electrically conductive material having an electrically insulating surface layer comprising at least one door, one body and one electrically conductive elastic seal disposed therebetween, electrically conductuctive strip material connected to the conductive material of the housing elements; the housing elements having electrically conductive contact locations respectively dispose at said electrically conductive strip material connected to the conductive material of the housing elements; each of said contact locations being covered by a protective layer removable during assembly of the cabinet; said seal being electrically conductively fastened to one of said housing element by one of said contact locations, for contacting the other of said contact locations upon closing the door to ensure a conductive connection between the housing elements, for the purpose of electrically conductively connecting the housing elements and said seal.

2. The housing according to claim 1, wherein said protective layer is formed of at least one material selected from the group consisting of paper, plastic material, metal and a composite material.

3. The housing according to claim 1, wherein said contact location are elevations which have been at least one of embossed and stamped in the conductive material of the housing elements.

4. The housing according to claim 1, wherein said contact locations form a contact surface.

5. The housing according to claim 1, wherein said strip material is covered with a removable film.

6. The housing according to claim 1, wherein mutually corresponding contact locations are constructed at the housing elements, which are to be connected as a borehole into which a self-cutting conductive screw with a cutting thread is screwable; said self-cutting screw, when tightened, serving for cutting into the conductive material and for gas-tightly sealing said borehole.

7. The housing according to claim 6, wherein said self-cutting screw has at least one cutting element on an inner surface of a screw head thereof, and when said screw is tightened, said cutting element serves for cutting through the insulating surface coating into said conductive material of a respective adjoining housing element.

8. The housing according to claim 7, wherein said cutting element is an annular or ring cutter.

9. The housing according to claim 6, wherein said self-cutting screw has a surface with low contact resistance.

10. The housing according to claim 9, wherein said surface of said self-cutting screw is selected from the group consisting of zinc-plated, nickel-plated, chromated and blue-chromated surfaces.

11. The housing according to claim 1, wherein said seal is electrically conductively secured via a contact surface to at least one of said door and said body and contacts corresponding contact locations on an allocated opposing surface for assuring a conductive connection upon closing said door.

12. The housing according to claim 1, wherein said strip material is flexible.

* * * * *